United States Patent [19]

Tihanyi

[11] Patent Number: 5,672,893

[45] Date of Patent: Sep. 30, 1997

[54] PROTECTIVE CONFIGURATION AGAINST ELECTROSTATIC DISCHARGES IN SEMICONDUCTOR COMPONENTS CONTROLLABLE BY FIELD EFFECT

[75] Inventor: Jenoe Tihanyi, Kirchheim, Germany

[73] Assignee: Siemens Aktiengesellschaft, Munich, Germany

[21] Appl. No.: 590,931

[22] Filed: Jan. 24, 1996

[30] Foreign Application Priority Data

Jan. 24, 1995 [DE] Germany ............ 195 02 117.7

[51] Int. Cl.[6] ............ H01L 29/78; H01L 23/62; H01L 27/07
[52] U.S. Cl. ............ 257/328; 257/362
[58] Field of Search ............ 257/328, 356, 257/362

[56] References Cited

U.S. PATENT DOCUMENTS 4,963,970  10/1990  Throngnumchai et al. ............ 257/328
5,001,529  3/1991  Ohshima et al. ............ 257/362
5,426,320  6/1995  Zambrano ............ 257/328

OTHER PUBLICATIONS

Book: Power MOSFETs, Theory and Applications, by D. A. Grant and J. Gowar, 1989, pp. 486–492.

*Primary Examiner*—Gene M. Munson
*Attorney, Agent, or Firm*—Herbert L. Lerner; Laurence A. Greenberg

[57] ABSTRACT

A configuration for protecting a first semiconductor component being controllable by field effect against electrostatic discharges, includes a voltage-limiting, protective, second semiconductor component being connected to the gate terminal of the first semiconductor component. The second semiconductor component is an integrated bipolar transistor having a collector-to-emitter path being connected between the drain terminal and the gate terminal of the first semiconductor component.

4 Claims, 1 Drawing Sheet

PROTECTIVE CONFIGURATION AGAINST ELECTROSTATIC DISCHARGES IN SEMICONDUCTOR COMPONENTS CONTROLLABLE BY FIELD EFFECT

BACKGROUND OF THE INVENTION

FIELD OF THE INVENTION

The invention relates to a configuration for protecting a semiconductor component being controllable by field effect against electrostatic discharges, including a voltage-limiting protective component being connected to the gate terminal of the semiconductor component being controllable by field effect.

Semiconductor components being controllable by field effect, such as MOSFETs or IGBTs, are especially vulnerable to electrostatic discharges. Such discharges can occur whenever the person manipulating them is electrostatically charged and touches one of the terminals, especially the gate terminal. The electrostatic voltage is usually on the order of magnitude of a few hundred volts, so that particularly the oxide located between the gate electrode and the drain zone or between the gate electrode and the source zone, is destroyed.

In order to avoid electrostatic discharges, a great number of provisions have been proposed, for example in the book entitled: Power MOSFETs, Theory and Applications, by D. A. Grant and J. Gowar, 1989, pp. 486–492. It is recommended among other things that a Zener diode be connected between the gate terminal and the source terminal for diverting the electrostatic charges. However, that protects the component only in the event that the charge discharges to the gate terminal and the source terminal is grounded, or vice versa.

SUMMARY OF THE INVENTION

It is accordingly an object of the invention to provide a protective configuration against electrostatic discharges in semiconductor components that are controllable by field effect, which overcomes the hereinafore-mentioned disadvantages of the heretofore-known devices of this general type and with which the component is protected against discharges of both polarities even whenever either the drain terminal or the source terminal is connected to ground or to some other potential.

With the foregoing and other objects in view there is provided, in accordance with the invention, in a circuit including a first semiconductor component being controllable by field effect and having a gate terminal and a drain terminal, a configuration for protecting the first semiconductor component against electrostatic discharges, comprising a voltage-limiting, protective, second semiconductor component being connected to the gate terminal of the first semiconductor component, the second semiconductor component being an integrated bipolar transistor having a collector-to-emitter path being connected between the drain terminal and the gate terminal of the first semiconductor component.

In accordance with another feature of the invention, the bipolar transistor has a base terminal, the first semiconductor component has a source terminal, and there is provided a resistor connected between the base terminal of the bipolar transistor and the source terminal of the first semiconductor component.

In accordance with a further feature of the invention, the bipolar transistor and the first semiconductor component are integrated into a single semiconductor body.

In accordance with an added feature of the invention, the first semiconductor component has a drain zone, the bipolar transistor has a base zone embedded in and having an opposite conduction type from the drain zone, and the bipolar transistor has an emitter zone embedded in the base zone.

In accordance with a concomitant feature of the invention, the first semiconductor component is a MOSFET having base zones and source zones, the base zone of the bipolar transistor has the same doping and depth as the base zones of the MOSFET, and the emitter zone of the bipolar transistor has the same doping and depth as the source zones of the first semiconductor component.

Other features which are considered as characteristic for the invention are set forth in the appended claims.

Although the invention is illustrated and described herein as embodied in a protective configuration against electrostatic discharges in semiconductor components that are controllable by field effect, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
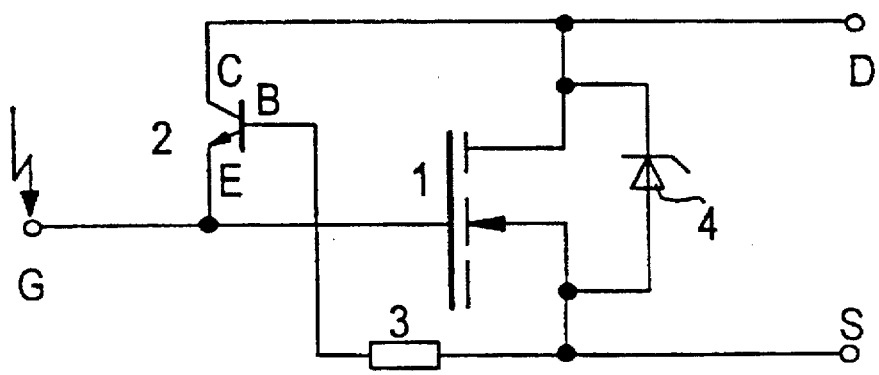
FIG. 1 is a schematic diagram showing a circuit according to the invention.

Referring now to the figures of the drawing in detail and first, particularly, to FIG. 1 thereof, there is seen a circuit which includes a first semiconductor component in the form of a MOSFET 1 having a drain terminal that is indicated by reference symbol D, a source terminal which is indicated by reference symbol S and a gate terminal which is indicated by reference symbol G. A second semiconductor component in the form of a bipolar transistor 2 has a collector-to-emitter path which is connected between the drain terminal D and the gate terminal G. The MOSFET is of the n-channel type, and the bipolar transistor is of the npn type. The bipolar transistor 2 has an emitter terminal E which is connected to the gate terminal G and a collector terminal C that is connected to the drain terminal D. If the MOSFET 1 is a PMOS, then a pnp bipolar transistor should be used. A base terminal B of the bipolar transistor 2 is connected through a resistor 3 to the source terminal S. A diode 4 which is connected between the source terminal S and the drain terminal D permits a flow of current from terminal S to terminal D. Such a diode is implicitly contained in any power MOSFET or IGBT.

In order to explain the function of the protective configuration, it should be assumed first that a positive static charge is discharging in the gate terminal, and the source terminal is connected to ground or to some other lower potential. The MOSFET 1 is made conducting, and the bipolar transistor 2 breaks down between an emitter zone and a base zone. Since the pn junction between the base zone and the collector zone is prestressed in the forward direction, a current flows through the bipolar transistor and the conducting MOSFET 1 to the source terminal and to ground.

If the static charge is negative and the source terminal is grounded, then the bipolar transistor is made conducting. The discharge current flows away from the source terminal to the gate terminal through the diode 4 and the bipolar transistor 2.

In the event that the drain terminal is at lower potential or is grounded and that a positive electrostatic charge is discharging into the gate terminal, then the emitter-base pn junction breaks down, and the discharge current flows from the gate terminal to the drain terminal. In the opposite case, the collector-to-base pn junction breaks down, and the discharge current flows from the drain terminal to the gate terminal.

Figure 2:
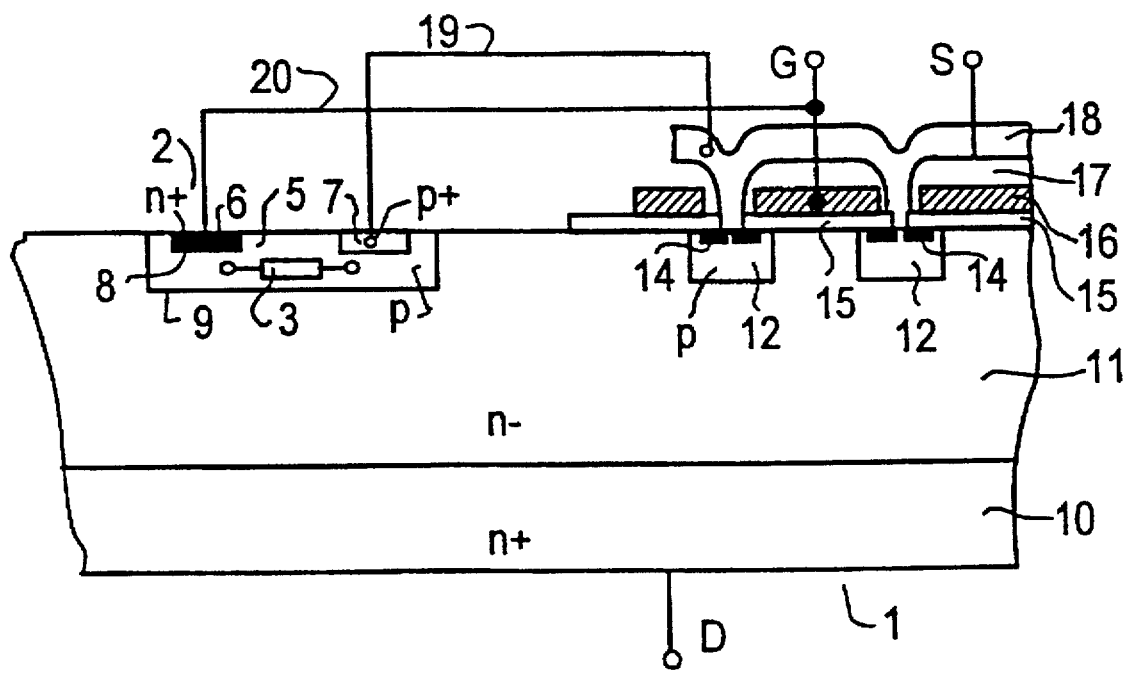
FIG. 2 is a sectional view showing an integrated layout of the circuit of FIG. 1.

If a negative charge is discharging into the drain terminal and the source terminal is grounded, then the current flows in the forward direction through the diode 4. In the case of a positive discharge into the drain terminal, the diode 4 breaks down, and the current flows from the drain terminal to the source terminal. The protective configuration can easily be integrated into the semiconductor body of the MOSFET 1, as is shown in FIG. 2. The MOSFET 1 is built up on a substrate 10 on which a drain zone 11 is formed. Base zones 12 are embedded in the drain zone 11, and source zones 14 are in turn embedded in planar fashion in the base zones 12. A surface of the MOSFET 1 is covered with a gate oxide layer 15, on which a gate electrode 16 is disposed. The gate electrode 16 is in turn covered with an oxide layer 17, on which a metal layer 18 is located. This metal layer 18 serves as a source electrode. The doping and conductivity, beginning at the substrate 10, are n+n–pn+, for instance.

A zone 5 of the opposite conduction type from the drain zone 11 is embedded in the drain zone 11 and serves as a base zone for the bipolar transistor 2. A strongly n-conducting emitter zone 6 and a strongly p-conducting contact zone 7 are embedded in the base zone 5. The emitter zone 6 is connected through a line 20 to the gate terminal G, and the base zone 5 is connected through the contact zone 7 and a line 19 to the source terminal S. These lines are typically aluminum conductor tracks.

Upon an electrostatic discharge, depending on the polarity, either a pn junction 8 between the emitter zone 6 and the base zone 5, or a pn junction 9 which is located between the base zone 5 and the drain zone 11 acting as a collector zone, breaks down, or else the bipolar transistor is made conducting.

Integrating the bipolar transistor 2 requires no significant additional expense as long as the base zone of the bipolar transistor has the same doping and depth as the base zones at the MOSFET and the emitter zone of the bipolar transistor has the same doping and depth as the source zones of the MOSFET. A practical version of the bipolar transistor has an emitter zone 6 that is doped, for instance, with a dose of $5 \times 10^{15}$ cm$^{-2}$. It has a depth of 0.3 to 0.6 μm, for example. The base zone has a doping of $10^{13}$ cm$^{-2}$, for instance, and a depth of 3 to 4 μm. The contact zone 7 may, for instance, have a doping of $5 \times 10^{14}$ cm$^{-2}$. The spacing between the emitter zone and the contact zone 7 is 5 μm, for instance, as a result of which, given a doping of the base zone of $10^{13}$ cm$^{-2}$, for instance, and a width of approximately 1 mm extending into the plane of the drawing, a resistance of approximately 100 Ω is brought about.

The invention has been described in terms of a MOSFET. However, the protective device is usable for other semiconductor components controllable by field effect as well, such as IGBTs or MOS-GTO thyristors.

I claim:

1. In a circuit including a first semiconductor component being controllable by field effect and having a gate terminal, a source terminal, and a drain terminal, a configuration for protecting the first semiconductor component against electrostatic discharges, comprising:

a voltage-limiting, protective, second semiconductor component being connected to the gate terminal of the first semiconductor component, said second semiconductor component being an integrated bipolar transistor having a base terminal and a collector-to-emitter path connected between the drain terminal and the gate terminal of the first semiconductor component; and a resistor connected between said base terminal of said bipolar transistor and the source terminal of the first semiconductor component.

2. The circuit according to claim 1, wherein said bipolar transistor and the first semiconductor component are integrated into a single semiconductor body.

3. The circuit according to claim 2, wherein the first semiconductor component has a drain zone, said bipolar transistor has a base zone embedded in and having an opposite conduction type from the drain zone, and said bipolar transistor has an emitter zone embedded in the base zone.

4. The circuit according to claim 3, wherein the first semiconductor component is a MOSFET having base zones and source zones, said base zone of said bipolar transistor has the same doping and depth as said base zones of the MOSFET, and said emitter zone of said bipolar transistor has the same doping and depth as said source zones of the first semiconductor component.

* * * * *